United States Patent
Matsushita et al.

(10) Patent No.: US 6,756,850 B2
(45) Date of Patent: Jun. 29, 2004

(54) HIGH FREQUENCY POWER AMPLIFIER CIRCUIT

(75) Inventors: Kouichi Matsushita, Komoro (JP); Tomio Furuya, Sawa (JP); Fuminori Morisawa, Kawagoe (JP); Takayuki Tsutsui, Saku (JP); Nobuhiro Matsudaira, Chigasaki (JP)

(73) Assignees: Renesas Technology Corp., Tokyo (JP); Hitachi Communication Systems, Inc., Kanagawa (JP)

( * ) Notice: Subject to any disclaimer, the term of this patent is extended or adjusted under 35 U.S.C. 154(b) by 0 days.

(21) Appl. No.: 10/147,065

(22) Filed: May 17, 2002

(65) Prior Publication Data

US 2003/0001676 A1 Jan. 2, 2003

(30) Foreign Application Priority Data

Jun. 29, 2001 (JP) ...................................... 2001-198308

(51) Int. Cl.[7] .............................................. H03G 3/10
(52) U.S. Cl. ...................................... 330/285; 330/288
(58) Field of Search ................................. 330/133, 285, 330/288, 310, 311; 323/315, 316

(56) References Cited

U.S. PATENT DOCUMENTS

| | | | | |
|---|---|---|---|---|
| 3,950,708 A | * | 4/1976 | Hall | 330/29 |
| 4,251,778 A | * | 2/1981 | Ahmed | 330/279 |
| 4,267,521 A | * | 5/1981 | Yokoyama | 330/288 |

FOREIGN PATENT DOCUMENTS

| | | |
|---|---|---|
| JP | 11-150483 | 6/1999 |
| JP | 2001-102881 | 4/2001 |

* cited by examiner

*Primary Examiner*—Henry Choe
(74) *Attorney, Agent, or Firm*—Mattingly, Stanger & Malur, P.C.

(57) ABSTRACT

A module including a bias circuit that generates gate bias voltages by resistance dividers creates a problem in that the values of the resistances constituting the bias circuit must be finely adjusted, and accordingly extra trimming tasks are required. The present invention provides current generators that generate currents varying with desired characteristics responsive to a control voltage, independent of variations in transistor threshold voltages, connects output resistors to parallel transistors in respective stages to form current mirror circuits, and supplies currents from the current generators thereto to drive them, instead of supplying dividing voltages.

29 Claims, 6 Drawing Sheets

HIGH FREQUENCY POWER AMPLIFIER CIRCUIT

BACKGROUND OF THE INVENTION

The present invention relates to a multi-stage high-frequency power amplifier circuit with a plurality of cascaded semiconductor amplifier devices and technology that is useful when applied to wireless communication devices such as cellular phones incorporating a high-frequency power amplifier circuit, and more particularly to a high-frequency power amplifier circuit capable of obtaining output with desired characteristics, independent of variations in semiconductor amplifier device characteristics.

The transmission output stage of car phones, cellular phones, and other wireless communication devices (mobile communication devices), as shown in FIG. 1, includes a multi-stage high-frequency power amplifier circuit with cascaded semiconductor amplifier devices Q1, Q2, and Q3 made of MOSFETs (Metal Oxide Semiconductor Field-Effect Transistors), GaAs-MESFETs (Metal Semiconductor Field-Effect Transistors), or other applicable kinds of transistors. The high-frequency power amplifier circuit shown in FIG. 1 generally includes a discrete last-stage semiconductor amplifier device Q3 (such as an output power MOSFET), and preceding-stage semiconductor amplifier devices Q1 and Q2 and a bias circuit BIAS that are integrated onto a single semiconductor chip as a semiconductor integrated circuit. The combination of this discrete semiconductor amplifier device part and a semiconductor integrated circuit including a bias circuit, together with capacitive elements and other circuit elements will be referred to as a high-frequency power amplifier module or just as a module hereinafter.

In general, a cellular phone system is configured to change its output (transmission power) in different communication environments according to power-level command signals from a base station, so as not to interfere with other cellular phones. For example, a high-frequency power amplifier module in the transmission output stage of cellular phones adopting the U.S. 900-MHz band standard system or the European GSM (Global System for Mobile Communications) system is configured so that the gate bias voltages of the output power MOSFETs Q1 to Q3 are controlled by the output voltage Vapc of an Automatic Power Control (APC) to produce the output power required for communication.

Conventionally, the gate bias voltages of the output power MOSFETs are generated by using a bias circuit BIAS consisting of resistance dividers as shown in FIG. 1, in which the output voltage Vapc of the APC circuit is divided by the ratios of paired resistances R11 and R12, R21 and R22, and R31 and R32 to generate gate bias voltages Vg1, Vg2, and Vg3 (see, for example, Unexamined Japanese Patent Publication No. Hei 11(1999)-150483).

Some conventional systems, as shown in FIG. 2, use a bias circuit that is configured with a plurality of resistances R1 to R4 connected in series with a MOSFET Qd that functions as a diode, forming a resistive voltage in which the ratio of the resistance values is adjusted so that the maximum output power can be obtained when Vapc is in the high neighborhood of 2 V, generating the gate bias voltages Vg1, Vg2, and Vg3 of the output power MOSFETs in each stage (see, for example, Unexamined Japanese Patent Publication No. 2001-102881).

As described above, all of the conventional gate bias circuits above apply bias voltages generated by dividing the output voltage Vapc of the APC circuit to the gates of the output power MOSFETs.

SUMMARY OF THE INVENTION

Output power MOSFETs show variations in threshold voltages due to manufacturing process variations and temperature changes. In addition, the last-stage MOSFET Q3 among the output power MOSFETs, in particular, is often a discrete part. Therefore, the last-stage MOSFET Q3 and preceding-stage MOSFETs Q1 and Q2 differ in regard to the variations in the threshold voltage. More specifically, the gate voltage-drain current characteristics of the output power MOSFETs are different from each other.

In such a high-frequency power amplifier module configured with output power MOSFETs having different variations in their threshold voltages, if a gate bias voltage that is generated by dividing the output voltage Vapc of the APC circuit according to the ratio of resistances is applied to the gate terminals of the output power MOSFETs, the output characteristic of the high-frequency power amplifier circuit may deviate greatly from a desired characteristic. As a result, a module with a bias circuit that generates gate bias voltage by dividing resistances requires fine tuning of the resistance values making up the bias circuit; this obviously creates a problem in that extra trimming tasks or trimming resistors are required.

Accordingly, an object of the present invention is to provide a high-frequency power amplifier circuit capable of obtaining desired characteristics without trimming the values of resistors making up the bias circuit.

Another object of the present invention is to provide a high-frequency power amplifier circuit with better output controllability.

Another object of the present invention is to provide a high-frequency power amplifier circuit capable of efficiently obtaining higher output with lower power consumption.

The aforementioned and other objects and new features of the present invention will become clear from the description in this specification when read with reference to the attached drawings.

The outline of a typical mode of practicing the invention disclosed herein will be described below.

In a multi-stage high-frequency power amplifier circuit with a plurality of cascaded output semiconductor amplifier devices Q1, Q2, and Q3, the invention typically provides semiconductor amplifier devices Q11, Q12, and Q13 connected to the plurality of output semiconductor amplifier devices to form current mirror circuits respectively, causing electric currents I11, I12, and I13 changing with given characteristics according to control voltage to flow into the semiconductor amplifier devices and driving the plurality of output semiconductor amplifier devices with the currents.

The method described above drives the output semiconductor amplifier devices with currents having given characteristics, thereby making it possible to obtain a high-frequency power amplifier circuit with output characteristics not sensitive to possible variations in the threshold voltages and other characteristics of the output semiconductor amplifier devices.

The semiconductor amplifier devices are preferably field effect transistors, and the given characteristics are their gate voltage-drain current characteristics. Since the drain current of a field effect transistor is proportional to the square of the gate voltage, the control voltage can reduce the rate of change of the output in the vicinity of the threshold voltage of the field effect transistor and increase the rate of change of the output by increasing itself, thereby making it possible to achieve higher output controllability and larger output power.

According to another aspect of the invention disclosed herein, in a high-frequency power amplifier circuit having a multi-stage output circuit with a plurality of cascaded semiconductor amplifier devices Q1, Q2, and Q3 and a bias circuit that drives the semiconductor amplifier devices responsive to a control voltage, the invention provides semiconductor amplifier devices Q11, Q12, and Q13 that are connected to the plurality of output semiconductor amplifier devices so as to form current mirror circuits; the bias circuit has a voltage-to-current converter 10, a first resistance R1 that converts currents I1 and I3 supplied from the voltage-to-current converter, a first constant-current source 31, and a first semiconductor amplifier device Q32 connected in series thereto; also included is a control voltage generator 30 that generates a voltage equal to the threshold voltage of the first semiconductor amplifier device; a second semiconductor amplifier device Q21 (Q31) generates current according to a combination of the voltage generated by the control voltage generator and the voltage converted by the first resistance; and currents I11, I12, and I13 with the same characteristic as that of current I21 flowing through the second semiconductor amplifier device are passed through the semiconductor amplifier devices connected to the plurality of output semiconductor amplifier devices in pair respectively so as to form the current mirror circuits to drive the plurality of output semiconductor amplifier devices.

Preferably, the control voltage generator has a voltage follower 33 including a first differential circuit that receives a voltage equal to the threshold voltage of the first semiconductor amplifier device; the first resistance R1 is connected to the output terminal of the voltage follower; and currents I1 and I3 fed from the voltage-to-current converter via the first resistance are caused to flow through the voltage follower. This enables the voltage follower, which has small output impedance, to sink sufficient currents I1 and I3 supplied from the voltage-to-current converter and generate a voltage proportional to the currents I1 and I3 supplied from the voltage-to-current converter through the first resistance to be applied to the control terminal of the second semiconductor amplifier device to produce current.

More preferably, second constant-current sources 21a and 21c that are connected to the control terminals of the second semiconductor amplifier devices and sink current supplied from the voltage-to-current converter are provided. This can produce an initial control voltage at which the current passing through the second semiconductor amplifier devices starts to change, thereby making it easier to obtain a desired current characteristic.

The first constant-current source 31 is configured to include a second differential circuit 312 receiving a constant voltage as an input from a band gap reference circuit 311 that generates a constant voltage and a third semiconductor amplifier device Q30 that carries constant current from the output of the second differential circuit. This can make the current characteristic of the first output semiconductor amplifier device constant regardless of variations in the power source voltage.

In addition, the second differential circuit 312 has its output fed back to the other input through a circuit including an amplifier device Q44 and a second resistance R4. This feedback causes the second differential circuit to output a voltage Vc1 proportional to the constant voltage Vref from the output terminal. The third semiconductor amplifier device Q30 forms a current mirror with the amplifier device Q44 to pass a current responsive to the value of the second resistance R4 as a constant current I4. The second resistance R4 is constituted by an external device. Since an external device can be provided with higher accuracy than a device integrated on a chip, using it can improve operation accuracy of the circuit.

In addition, the second constant-current source 21a (21c) is configured to include a third differential circuit 321 that receives a constant voltage (Vref) as an input from the band gap reference circuit 311, which generates a constant voltage with little dependecy on the power source voltage, and a fourth semiconductor amplifier device Q31 that carries constant current responsive to the output Vc2 of the third differential circuit. This makes it possible to provide the first output semiconductor amplifier device with a constant current characteristic independent of variations in the power source voltage.

The output of the third differential circuit 321 is fed back to the other input via a circuit including an amplifier device Q45 and a third resistance R5. This feedback causes the third differential circuit to output a voltage Vc2 proportional to the constant voltage Vref from the output terminal. The fourth semiconductor amplifier device Q31 constitutes a current mirror with the amplifier device Q45 and is configured to pass current responsive to the value of the third resistance R5 as a constant current I5a (I5c); the third resistance R5 is formed integrally with the first to fourth semiconductor amplifier devices in the same semiconductor chip. When the output currents I1 and I3 vary due to manufacturing process variations in the value of the resistance R2 provided in the voltage-to-current converter 10, this configuration causes the same variation in the value of the third resistance R5 as in the resistance R2 in the voltage-to-current converter, which causes a current I5a (I5c) to change, thereby enabling the changes in the output currents I1 and I3 to be canceled.

Furthermore, the first resistance, the second semiconductor amplifier device, and the second current source are provided for each of the plurality of the output semiconductor amplifier devices; the resistance value of the first resistance and the current value of the second current source are set to mutually differing values. This enables separate control with desired characteristics of the plurality of output semiconductor amplifier devices, thereby making it possible to achieve a high-frequency power amplifier circuit with better output controllability and capable of efficiently obtaining higher output with lower power consumption.

DETAILED DESCRIPTION OF THE PREFERRED EMBODIMENTS

Preferable embodiments of the present invention will be described with reference to the attached drawings below. Although the following description will use a field effect transistor (FET) as an example of a semiconductor amplifier device, the semiconductor amplifier device is not limited to a field effect transistor; it may be a bipolar transistor, hetero-junction bipolar transistor (HBT), high-electron-mobility transistor (HEMT), or another applicable kind of transistor; a semiconductor substrate forming a transistor is not limited to a silicon substrate; it may also be a silicon-germanium or gallium-arsenic substrate, or one made of another applicable material.

Figure 3:
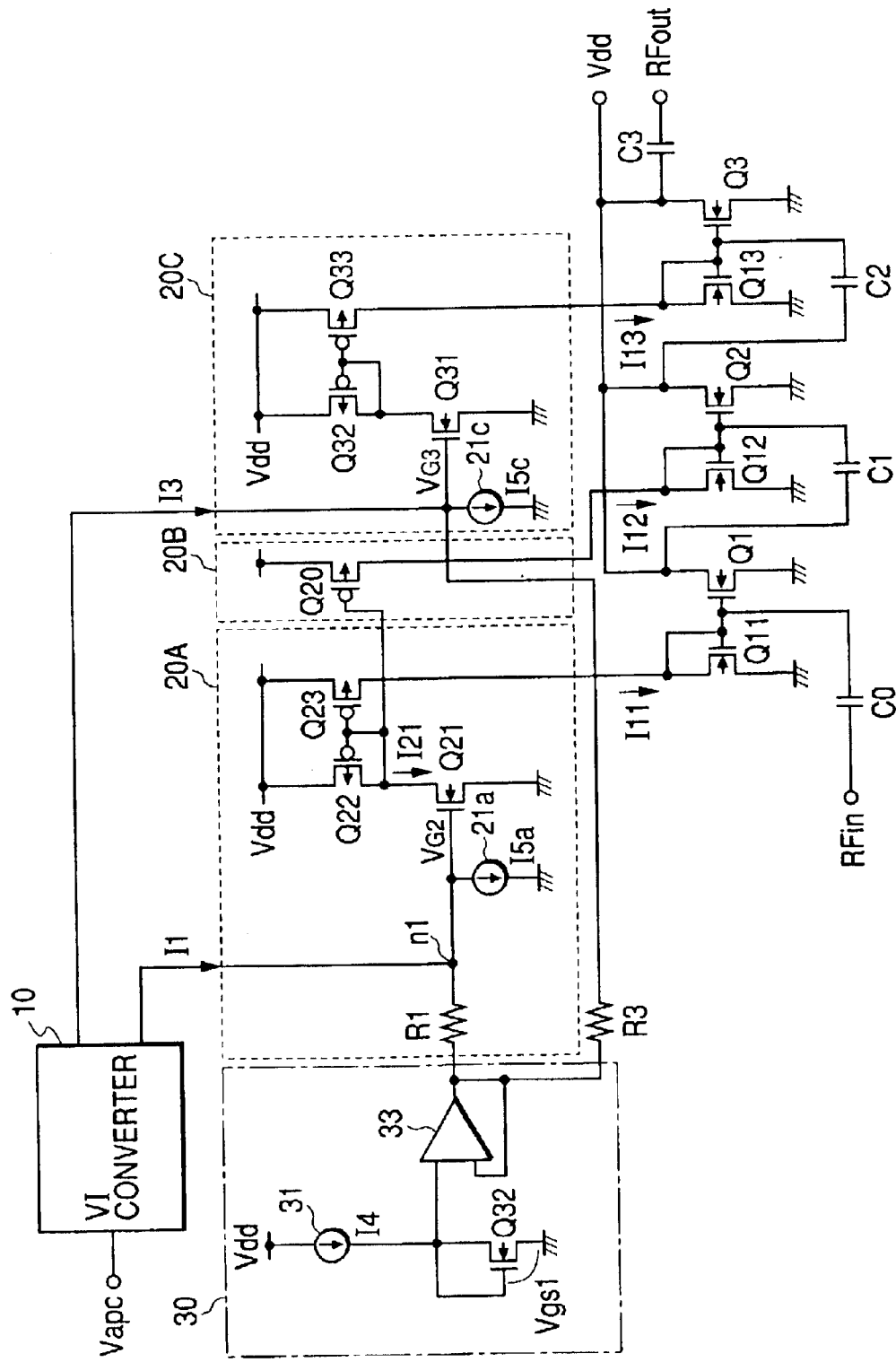
FIG. 3 is a circuit diagram showing an embodiment of a high-frequency power amplifier circuit according to the present invention.

FIG. 3 shows an embodiment of a high-frequency power amplifier circuit according to the present invention. In FIG. 3, Q1, Q2, and Q3 indicate output power MOSFETs used as output transistors; these output power MOSFETs Q1, Q2, and Q3 are interconnected so that the drain terminal of the preceding-stage FET is connected to the gate terminal of the next-stage FET via capacitive elements C1 and C2. The gate terminal of the first-stage output power MOSFET Q1 receives a radio-frequency signal RFin via a capacitive element C0; the drain terminal of the last-stage output power MOSFET Q3 is connected to an output terminal OUT via a capacitive element C3, eliminates the direct-current components of the radio-frequency signal Rfin, amplifies only the alternate-current components, and outputs the resultant signal. The output power at this time is controlled by the bias circuit described below.

This embodiment provides MOSFETs Q11, Q12, and Q13 paired in parallel with the output power MOSFETs Q1, Q2, and Q3, their drains being connected to the gates of the output power MOSFETs Q1, Q2, and Q3 respectively to provide a diode function; the gates of MOSFETs Q11, Q12, and Q13 are connected with the gates of the output power MOSFETs Q1, Q2, and Q3, thereby forming current mirror circuits.

In the high-frequency power amplifier circuit shown in FIG. 3, the last-stage output power MOSFET Q3 and MOSFET Q13 forming a current mirror circuit with Q3 are formed onto a single semiconductor chip as a discrete part; the preceding-stage output power MOSFETs Q1 and Q2 and MOSFETs Q11 and Q12 paired with them respectively to form current mirror circuits, and a bias circuit that feeds bias current to MOSFETs Q11 to Q13 are formed on another single semiconductor chip as a semiconductor integrated circuit. The capacitive elements C0, C1, C2, and C3 are discrete parts, connected to the semiconductor integrated circuit including the bias circuit as external devices.

The bias circuit includes a voltage-to-current converter 10 that outputs currents I1 and I3 proportional to a control voltage Vapc; current generators 20A, 20B, and 20C that generate currents with desired characteristics little dependency on thresholds, based on the currents I1 and I3, and feed the currents to the MOSFETs Q11, Q12, and Q13 for forming the current mirror circuits; and a gate voltage control circuit 30 that generates a bias voltage for these current generators 20A, 20B, and 20C and causes the current generators 20A, 20B, and 20C to output currents with given characteristics.

The current generators 20A and 20C have the same circuit configuration. Although not limited to this, this embodiment has a structure in which the current generator 20B that generates current I12 fed to the MOSFET Q12 connected to the second-stage output power MOSFET Q2 to form a current mirror circuit includes a MOSFET Q20 connected to an output MOSFET Q22 of the current generator 20A to form a current mirror circuit, and the MOSFET Q20 generates current I12 having the same characteristic as that of the current I11 fed from the current generator 20A to the MOSFET Q11. The ratio of currents I11 and I12 can be adjusted by changing the size ratio of MOSFETs Q22 and Q20.

The gate voltage control circuit 30 includes a constant-current source 31; a MOSFET Q32 connected to the constant-current source 31 in series; and a differential amplifier 33 that receives a drain voltage of the MOSFET Q32 to behave as a voltage follower. The MOSFET Q32 with its gate and drain connected to function as a diode outputs a voltage equal to the threshold voltage Vgs1 from the drain terminal to the differential amplifier 33; the differential amplifier 33 outputs a voltage at the same level as that of the input voltage, or at the same level as that of the threshold voltage Vgs1 of the MOSFET Q32.

The current generator 20A includes a source-follower MOSFET Q21; a resistance R1 inserted between the gate terminal of the MOSFET Q21 and the output terminal of the differential amplifier 33 in the gate voltage control circuit 30; a constant-current source 21a that is connected between the gate terminal of the MOSFET Q21 and ground and passes constant current I5a; a MOSFET Q22 inserted in series between the drain terminal of the MOSFET Q21 and a power source voltage terminal Vdd; and a MOSFET Q23 with the gate terminal connected to the gate of the MOSFET Q22 to form a current mirror circuit.

The termination of the wiring for supplying current I1 responsive to the control voltage Vapc output from the voltage-to-current converter 10 is linked to a connection node n1 of the resistance R1 and the gate terminal of the MOSFET Q21. This causes the current I1 from the voltage-to-current converter 10 to be distributed to the constant-current source 21a and the output terminal of the differential amplifier 33 if I1 is larger than I5a (I1>I5a), and to be fed all to the constant-current source 21a if I1 is smaller than I5a (I1<I5a). If I1 is smaller than I5a (I1<I5a), current with a value equal to I5a−I1 flows from the output terminal of the differential amplifier 33 toward the constant-current source 21a via the resistance R1.

The operations of the current generator 20A will be described below.

First, suppose the current generator 20a without the constant-current source 21a. Current I1 from the voltageto-current converter 10 flows through the resistance R1 and the output terminal of the differential amplifier 33 into the differential amplifier. The output voltage of the differential amplifier 33 is at the same level of that of the threshold voltage Vgs1 of the MOSFET Q32 as described above. Therefore, the gate voltage VG2 is higher than the output voltage Vgs1 of the differential amplifier 33 by R1·I1, or Vgs1+R1·I1. The current I1 fed from the voltage-to-current converter is proportional to the control voltage Vapc as described above.

Figure 4:
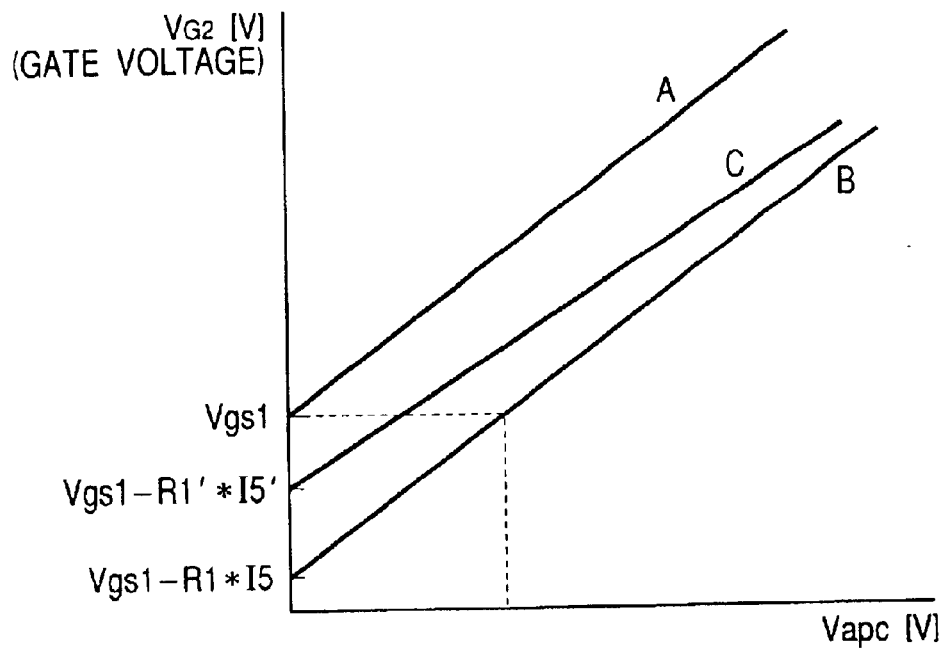
FIG. 4 is a graph showing relations between a control voltage Vapc in a bias circuit and a gate voltage of a bias-current generating MOSFET in the high-frequency power amplifier circuit according to the present invention.
Figure 5:
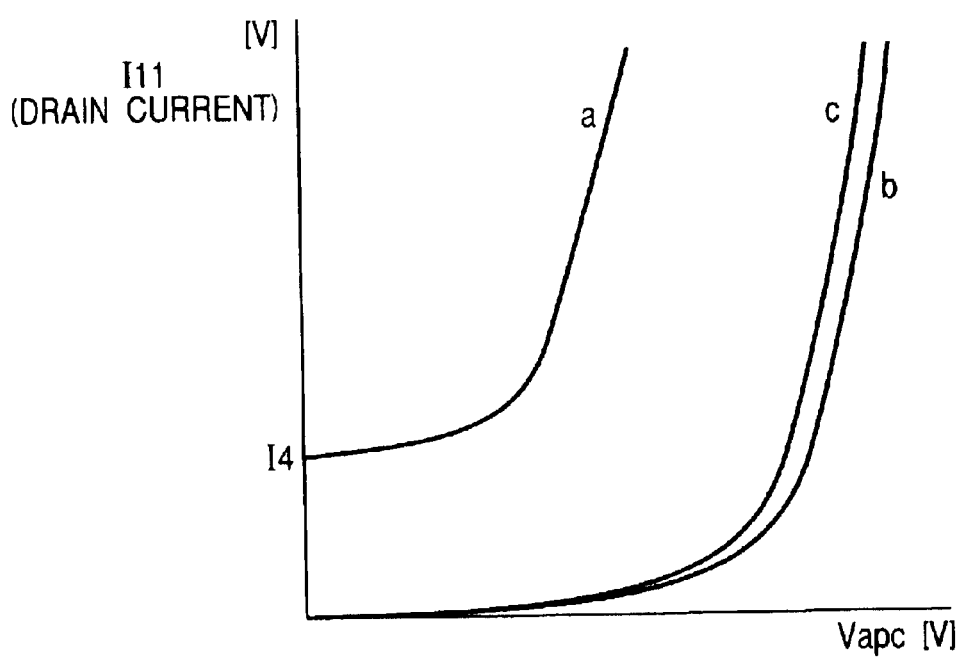
FIG. 5 is a graph showing relations between a control voltage Vapc in the bias circuit and a drain current of the bias-current generating MOSFET in the high-frequency power amplifier circuit according to the present invention.

Therefore, the gate voltage VG2 of the MOSFET Q21 varies almost linearly with the control voltage Vapc, as indicated by line A shown in FIG. 4. Then, the current I21 flowing through the MOSFET Q21 varies according to the drain current characteristic of the MOSFET responsive to the control voltage Vapc, as indicated by curve a shown in FIG. 5. Since the MOSFETs Q32 and Q21 are formed on a single semiconductor chip, the amounts of variation in their threshold voltages are the same. Specifically, as the threshold voltage of Q32 increases, the threshold voltage of Q21 increases by the same amount; as the threshold voltage of Q32 decreases, the threshold voltage of Q21 also decreases by the same amount.

As a result, the current I21 flowing into the MOSFET Q21 varies with a given characteristic regardless of the variations in the threshold voltage. Then the current I21 is passed through two current mirror circuits formed by the pairs of MOSFETs Q22 and Q23 and MOSFETs Q11 and Q1 to the output power MOSFET Q1. Therefore, the output power MOSFET Q1 carries a current with the same characteristic as the drain current characteristic of the MOSFET Q21. More specifically, even if the threshold voltage of the MOSFET Q1 deviates from a desired value due to manufacturing process variations and temperature changes, an output characteristic independent thereof can be obtained.

On the other hand, considering a case in which the constant-current source 21a is provided and current I5a flows therein, since the current I5a reduces a current flowing from the voltage-to-current converter 10 into the differential amplifier 33 via the resistance R1, the gate voltage VG2 of MOSFET Q21 is Vgs1+R1·I1−R1·I5a. Specifically, when the constant-current source 21a is provided, the gate voltage VG2 of the MOSFET Q21 can be plotted by line B in FIG. 4, which is line A shifted downward by R1·I5a.

The current I5a flowing into the constant-current source 21a is kept constant regardless of the control voltage Vapc. The current I1 fed from the voltage-to-current converter 10 is proportional to the control voltage Vapc. Therefore, the slope of line B is the same as that of line A. This causes the current I21 flowing through the MOSFET Q21 varies responsive to the control voltage Vapc along curve b in FIG. 5. The slopes of lines A and B shown in FIG. 4 can be adjusted by the value of the resistance R1, and can be reduced by reducing the value of the resistance R1, thus the controllability of the output power MOSFETs Q1 to Q3 by a control voltage Vapc can be improved.

The current generator 20C, as is the case with the current generator 20A, includes a source-follower MOSFET Q31; a resistance R3 inserted between the gate terminal of the MOSFET Q31 and the output terminal of the differential amplifier 33 in the gate voltage control circuit 30; a constant-current source 21c that is connected between the gate terminal of the MOSFET Q31 and ground and passes a constant current I5c; a MOSFET Q32 inserted between the drain terminal of the MOSFET Q31 and the power source voltage terminal Vdd in series; and a MOSFET Q33 with the gate terminal connected to the gate terminal of the MOSFET Q32 to form a current mirror circuit. The values of a current I5c flowing through the constant-current source 21c and the resistance R3 are set to values different from the values of a current I5a flowing through the constant-current source 21a in the current generator 20A and the resistance R1.

This causes the gate voltage VG3 of the MOSFET Q31 varies according to line C in FIG. 4, for example. As a result, the drain current, or the bias current I13 flowing in the current mirror circuit formed by the pair of MOSFETs Q13 and Q3 has a characteristic indicated by curve c in FIG. 5. Optimal setting of the values of the current I5c flowing through the constant-current source 21c in the current generator 20B and the resistance R3, and the values of the current I5a flowing through the constant-current source 21a in the current generator 20A and the resistance R1 makes it possible to obtain larger output with a smaller operating current.

Figure 1:
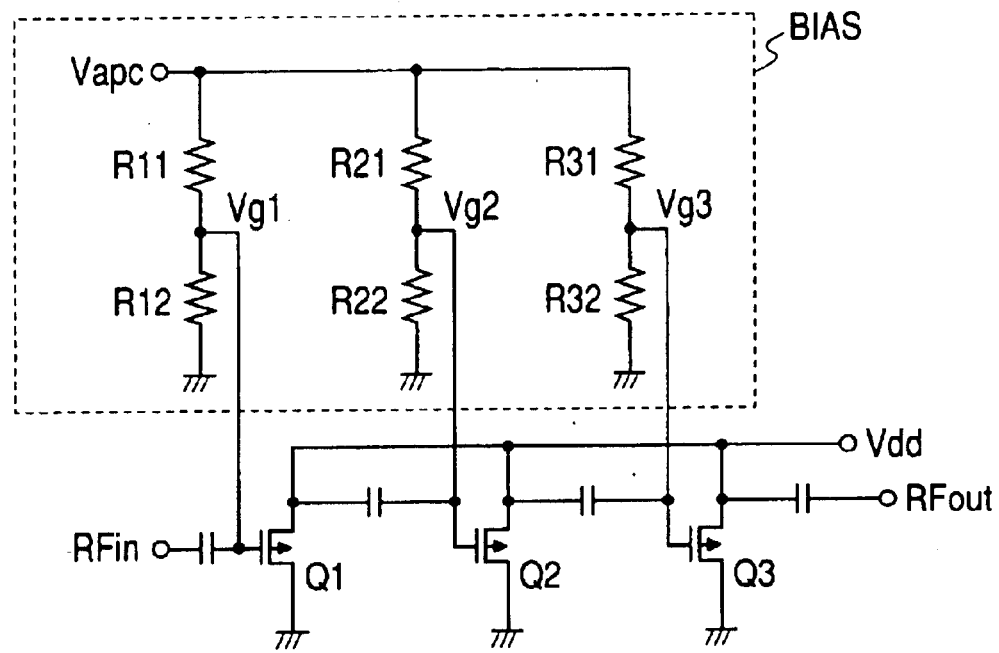
FIG. 1 is a circuit diagram showing an example of a conventional multi-stage high-frequency power amplifier circuit.
Figure 2:
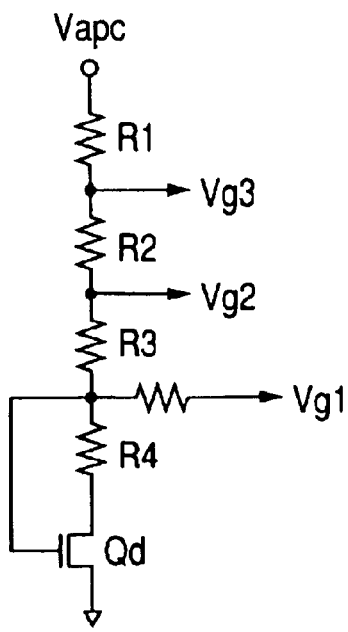
FIG. 2 is a circuit diagram showing another example of a bias circuit provided in a conventional high-frequency power amplifier circuit.

The bias circuit according to the embodiment shown in FIG. 1 configures the current generator 20B that generates a bias current for the second-stage output MOSFET Q2 only with the MOSFET Q20 connected to the MOSFET Q22 in the current generator 20A to form a current mirror, but it is also possible to configure the current generator 20B in the same way as with the current generator 20A and appropriately set the values of a current flowing through a current source equivalent to the constant-current source 21a and a resistance equivalent to the resistance R1 according to the output MOSFETs Q1 to Q3 used therein, thereby obtaining a desired characteristic for the entire module.

Figure 6:
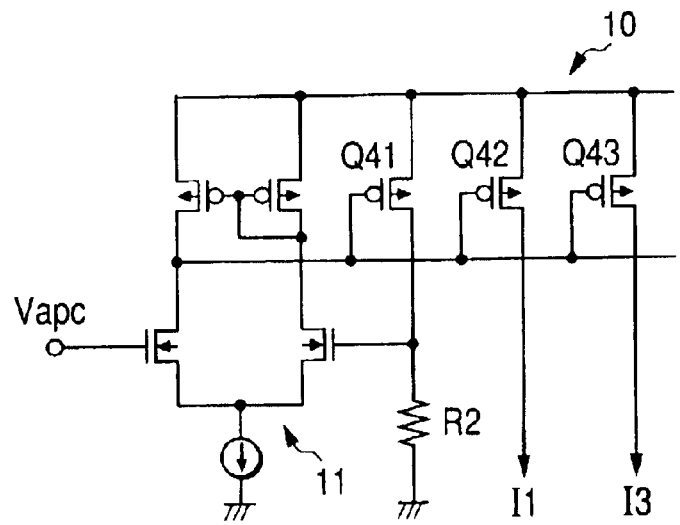
FIG. 6 is a circuit diagram showing a specific example of a voltage-to-current converter that converts a control voltage Vapc to a current supplied to the bias circuit.

FIG. 6 shows a specific example of the voltage-to-current converter 10 that generates currents I1 and I3 fed to the current generators 20A and 20C based on a control voltage Vapc.

The voltage-to-current converter 10 of this embodiment includes a differential amplifier 11 configured with a CMOS differential amplifier circuit that receives a control voltage Vapc as an input; MOSFETs Q41, Q42, and Q43 with the gate terminals to which a potential at the inverting output node of the differential amplifier 11 is applied; and a resistance R2 that is connected to the MOSFET Q41 in series: in which a potential at the connection node of the MOSFET Q41 and the resistance R2 is fed back to the other input terminal of the differential amplifier 11, whereby a drain current proportional to the input voltage Vapc is fed to each of the MOSFETs Q42 and Q43. The value of the drain current to the MOSFETs Q42 and Q43 can be set arbitrarily according to the size ratio (gate width W ratio) of the MOSFETs Q41 and Q42 and the value of the resistance R2 and the size ratio of the MOSFETs Q41 and Q43 and the value of the resistance R2, which is output as currents I1 and I3 fed to the current generators 20A and 20C respectively.

Figure 7:
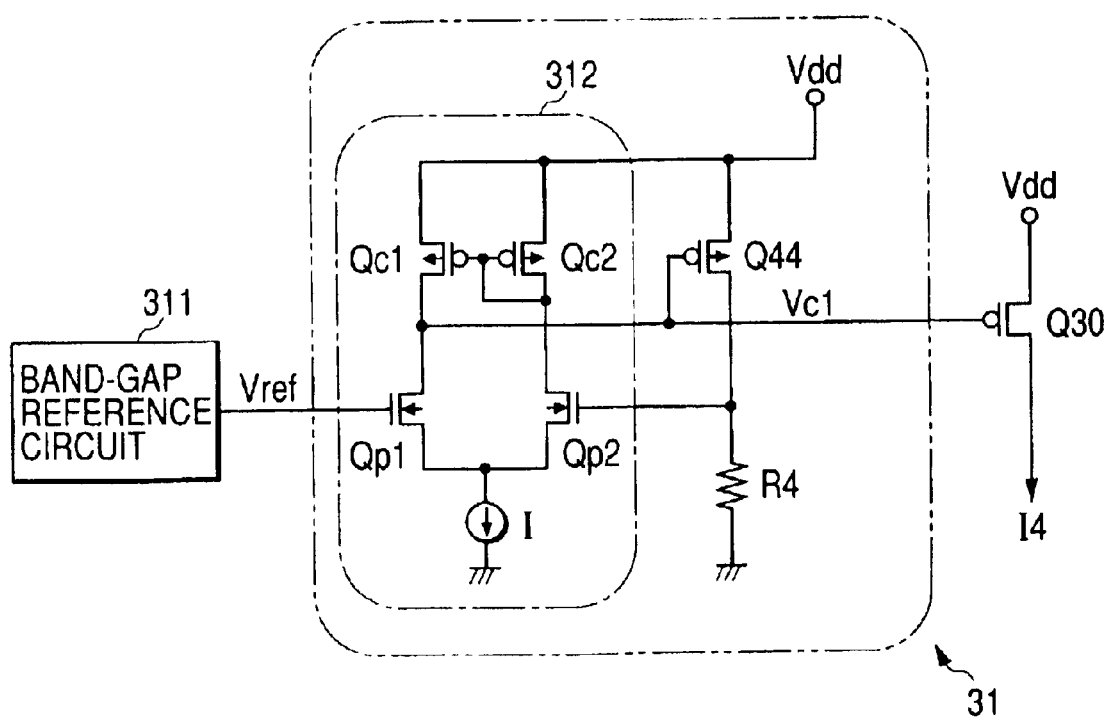
FIG. 7 is a circuit diagram showing a specific example of a constant voltage circuit that generates a constant voltage independent of a power source voltage.

FIG. 7 shows a specific example of a constant-current circuit as the constant-current source 31 that constitutes the gate voltage control circuit 30. The constant-current source 31 of this embodiment includes a band gap reference circuit 311 that generates a reference voltage Vref with little dependency on the power source; a differential circuit 312 receives a reference voltage Vref from the band gap reference circuit 311 as an input at one of its input terminals; a MOSFET Q44 that receives the output of the differential circuit 312 at the gate terminal; a resistance R4 inserted between the MOSFET Q44 and ground; and MOSFET Q30 that receives the output voltage Vc1 of the differential circuit 312 at the gate terminal: in which feedback is carried out from the point of interconnection of the MOSFET Q44 and the resistance R4 to the other input terminal of the differential circuit 312.

In the constant-current source 31 shown in FIG. 7, the output of the differential circuit 312 is fed back to the other input terminal thereof through a circuit including the MOSFET Q4 and the resistance R4. This makes it possible to obtain a constant voltage Vc1 responsive to the value of the resistance 4 from the output terminal of the differential circuit 312. Since the constant voltage Vc1 is also supplied to the gate of the MOSFET Q30, the MOSFET Q30 forms a current mirror in combination with the MOSFET Q44. Therefore, the MOSFET Q30 passes a current responsive to the value of the resistance R2 as a current I4. This embodiment uses an external resistive element as the resistance R2. This provides a configuration capable of outputting a current I4 with higher accuracy than obtainable with a resistance formed on the chip.

Figure 8:
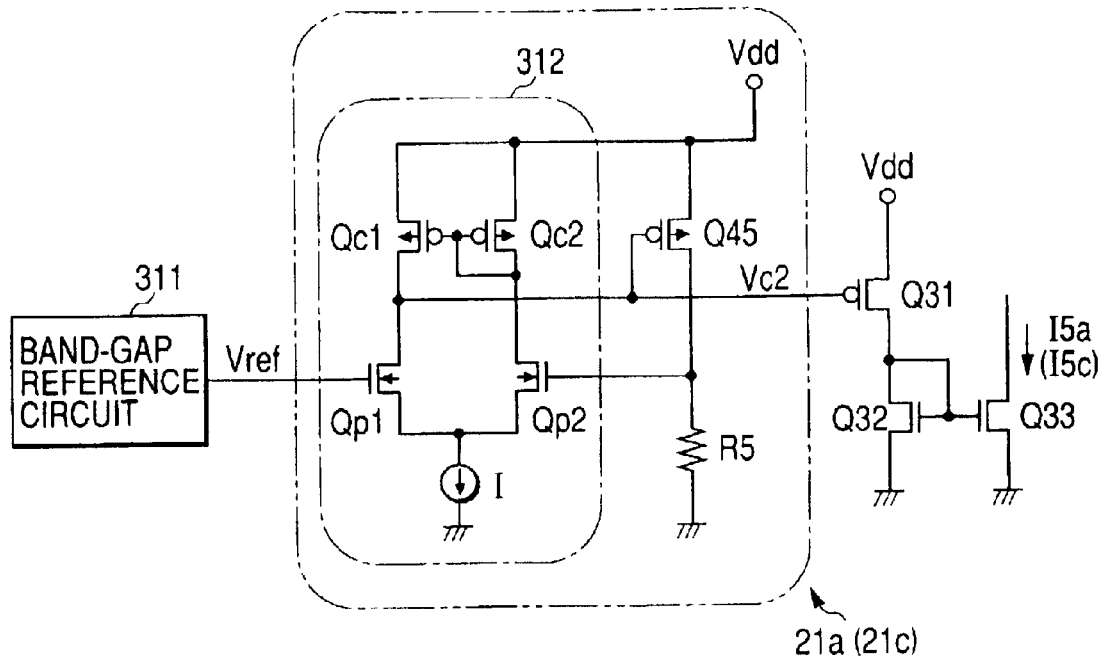
FIG. 8 is a circuit diagram showing a specific example of a constant voltage circuit that generates a constant voltage that cancels variations in current output from the voltage-to-current converter.

FIG. 8 shows a specific example of a constant-current circuit as the constant-current source 21a (21c) that constitutes the current generator 20A (20C). The constant-current source 21a (21c) of this embodiment includes a differential circuit 321 that receives a reference voltage Vref output from a band gap reference circuit 311 shared with the constant-current source 31 as an input at one of the input terminals; a MOSFET Q45 that receives the output of the differential circuit 321; a resistance R5 inserted between the MOSFET Q45 and ground; a MOSFET Q31 that receives the output voltage Vc2 of the differential circuit 321 at the gate terminal; a MOSFET Q32 that is connected to the MOSFET Q31 in series; and a MOSFET Q33 that is connected to the Q32 to form a current mirror: in which feedback is carried out from the point of interconnection of the MOSFET Q45 and the resistance R5 to the other input terminal of the differential circuit 312.

In the constant-current circuit 21a (21c) shown in FIG. 8, the output of the differential circuit 321 is fed back to the input terminal via a circuit including the MOSFET Q45 and the resistance R5. This makes it possible to obtain a constant voltage Vc2 responsive to the value of the resistance R5 from the output terminal of the differential circuit 321. Since the constant voltage Vc2 is also supplied to the gate terminal of the MOSFET Q31 that constitutes a current mirror in combination with the MOSFET Q45, the current responsive to the value of the resistance R5 flows through MOSFET Q31. The circuit is configured so that the drain current flowing in the MOSFET Q31 is copied by MOSFETs Q32 and Q33 that form a current mirror circuit in pair and a constant current I5a (I5c) flows through the MOSFET Q33.

Unlike the constant-current source 31 that passes the constant current I4 shown in FIG. 7, the constant-current source of this embodiment employs a resistance formed on the chip as the resistance R5, rather than an external device. When the output currents I1 and I3 change due to manufacturing process variations of the resistance R2 provided in the voltage-to-current converter 10 shown in FIG. 6, this configuration causes the same variation in the value of the resistance R5 that constitutes the constant-current source 21a (21c) shown in FIG. 8 as in the resistance R2, which causes an output current I5a to change, thereby enabling the changes in the output current I1 and I3 fed from the voltage-to-current converter 10 to be cancelled.

The differential circuits 312 and 321, although not limited to this configuration, include a pair of differential transistors Qp1 and Qp2, current mirror transistors Qc1 and Qc2 that constitute the load circuits thereof, and a constant current device I.

Figure 9:
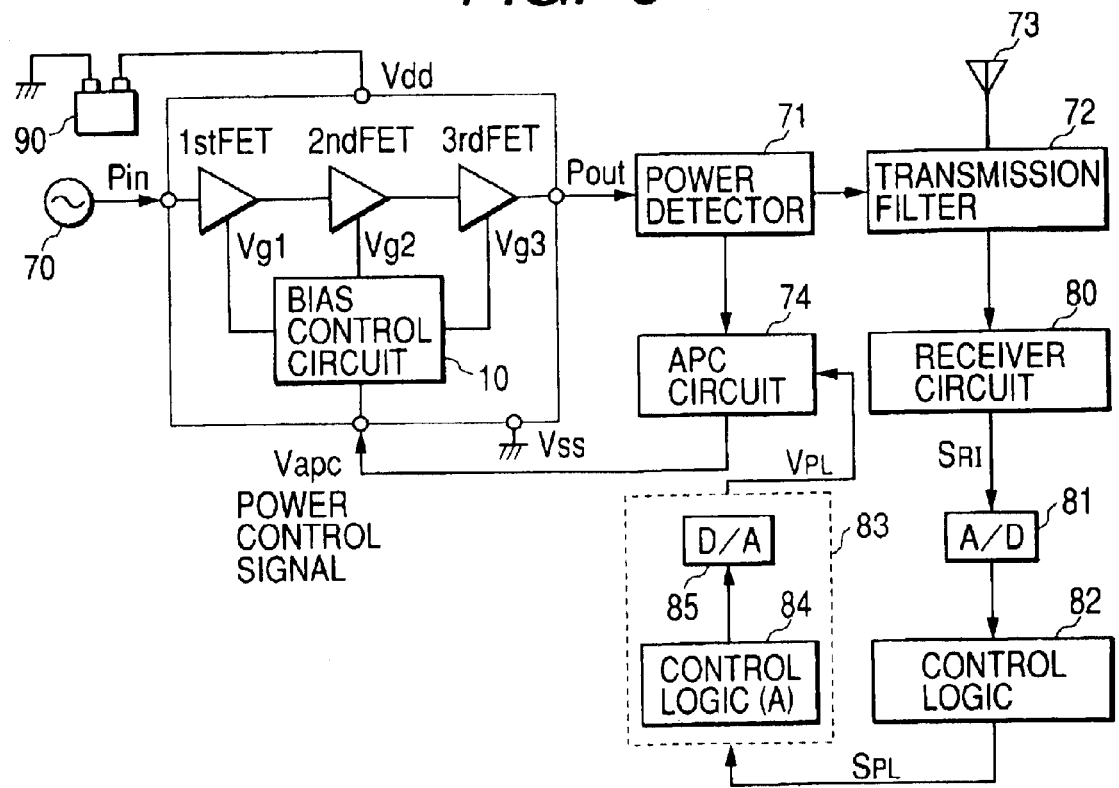
FIG. 9 is a circuit block diagram showing a part of a cellular phone including the high-frequency power amplifier circuit shown in FIG. 3.

FIG. 9 is a block diagram showing a portion of a cellular phone incorporating the high-frequency power amplifier circuit shown in FIG. 3.

In this cellular phone, as shown in FIG. 9, an RF transmission signal generated by oscillating operations of a modulation oscillator (VCO) 70 is input to the input terminal (Pin) of a high-frequency power amplifier module 1. The RF transmission signal is amplified in the high-frequency power amplifier module 1 and output from the output terminal (Pout), then transmitted through a power detector 71 and transmission filter 72 to an antenna 73, and transmitted as a radio wave therefrom.

On the other hand, an RF receive signal is subject to signal processing in a receiver circuit 80. The receiver circuit 80 outputs a received signal strength indication signal SRI, which is converted to a digital signal in an A/D converter 81 and supplied to a control logic 82. The control logic 82 outputs a power-level command signal SPL, which is supplied to a control logic circuit 84 in an output level controller 83. The control logic circuit 84 processes the received power-level command signal SPL to generate a control code, and the generated control code is converted to an analog signal in a D/A converter 85, which is supplied to the automatic power control (APC) circuit 74 as a power level command voltage VPL. The APC circuit 74 forms a power control signal Vapc responsive to the power level command voltage VPL and supplies it to the high-frequency power amplifier module 1, which drives an output transistor in response to this signal. Reference numeral 90 indicates a battery that supplies a power source voltage Vdd to the high-frequency power amplifier module 1.

Figure 10:
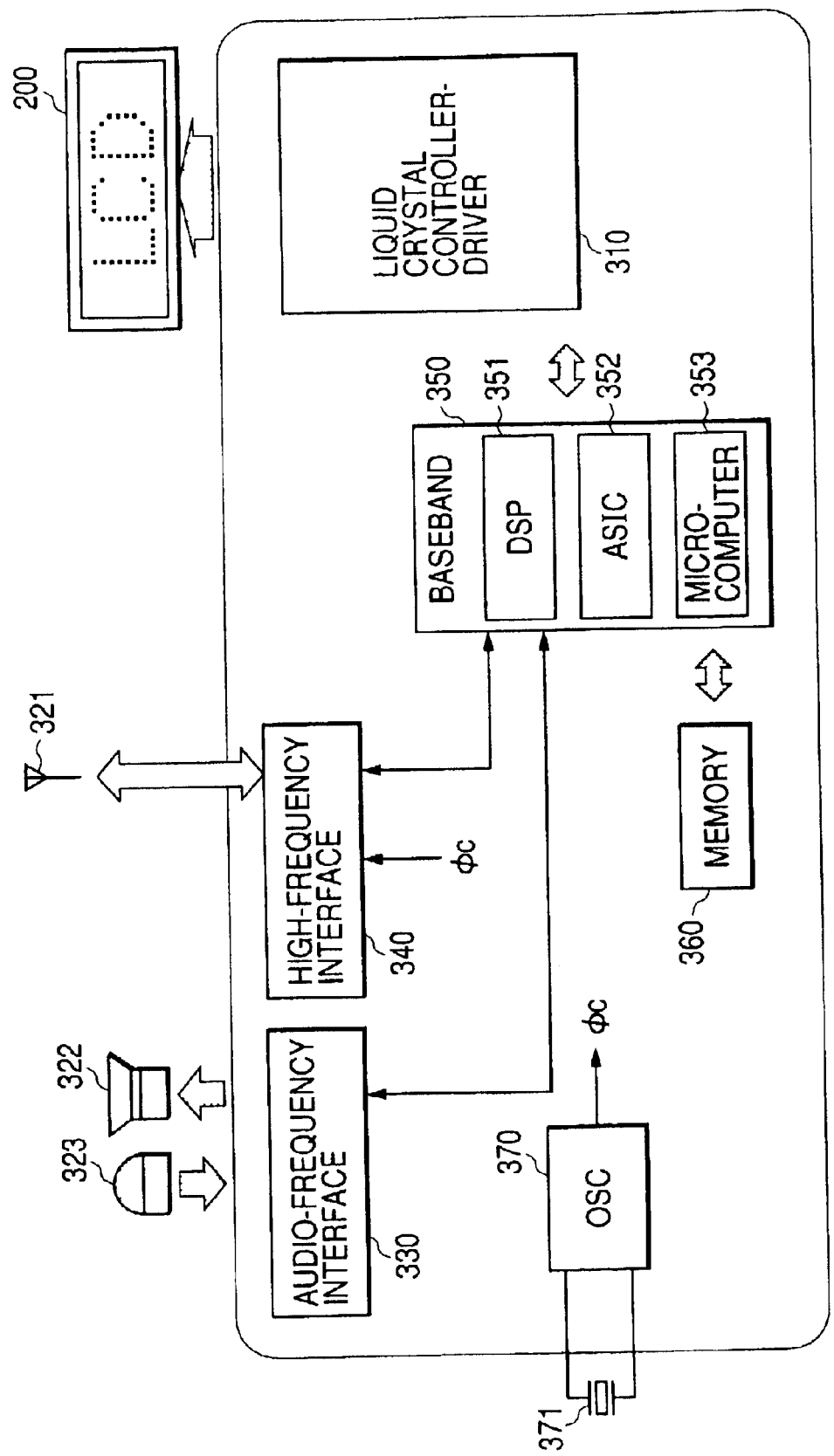
FIG. 10 is a block diagram showing the entire structure of a cellular phone using the high-frequency power amplifier circuit according to the embodiment.

FIG. 10 is a block diagram showing the entire structure of a cellular phone using the high-frequency power amplifier circuit of the embodiment.

The cellular phone of this embodiment includes a liquid crystal panel 200 as a display unit; an antenna 321 for transmitting and receiving signals; a voice output speaker 322; a voice input microphone 323; a liquid crystal control deriver 310 that drives the liquid crystal panel 200 to provide a display; an audio interface 330 that inputs and outputs signal for the speaker 322 and the voice input microphone 323; a high-frequency interface 340 that makes a GSM-system cellular phone communication via the antenna 321; a Digital Signal Processor (DSP) 351 that performs signal processing of voice signals and transmitting and receiving signals; an Application Specific Integrated Circuits (ASIC) 352 that provides custom functions (user logic); a system controller 353 including a micro processor or micro computer that controls the entire system including display control; a memory unit 360 for storing data and programs; an oscillator (OSC) 370; and other components. The DSP 351, ASIC 352, and micro computer 353 as a system controller constitute a so-called base band unit 350. The high-frequency power amplifier circuit of the embodiment above is employed in the transmission output unit of the high-frequency interface 340.

Although the invention has been described above in its preferred embodiments, it is needless to say that the invention is not limited to the specific embodiments described above and various changes may be made without departing from the spirit or scope of the invention. For example, the embodiments use three-stage output transistors, but it allows use of two-stage or four- or-more-stage structure. In addition, although it has been described that the last-stage output transistor Q3 and the transistor Q3 connected thereto to form a current mirror circuit are formed in a discrete chip, they may be formed together with the other output transistors Q1 and Q2 in the same chip as the one with the bias circuit, or in contrast, the output transistor Q1 and the current mirror transistor Q11 or the output transistor Q2 and the current mirror transistor Q12 may also be formed in a discrete chip.

Although the invention made by the inventors has been described above mainly in relation to a high-frequency power amplifier circuit applied in wireless communication devices, the invention is not limited to this field, but may be widely applied to multi-stage amplifier circuits with a plurality of cascaded semiconductor amplifier devices and systems including such circuits.

The outline of a typical mode of practicing the invention disclosed herein will be described below.

Specifically, since the output transistors are driven with currents having desired characteristics responsive to a control voltage, it is possible to obtain a high-frequency power amplifier circuit with output characteristics not sensitive to possible variations in the threshold voltages of the output transistors. In addition, driving an output transistor at each stage with a separate bias current makes it possible to achieve a high-frequency power amplifier circuit with better output controllability and capable of efficiently obtaining higher output with lower power consumption.

What is claimed is:

1. A high-frequency power amplifier circuit comprising:
    an output circuit having a plurality of cascaded semiconductor power devices;
    semiconductor devices that are arranged so as to form current mirror circuits with the plurality of semiconductor power devices; and
    a bias circuit that biases the semiconductor devices according to a control voltage,
    wherein the bias circuit includes a voltage-to-current converter that converts a control voltage to current; a first resistance for converting current supplied from the voltage-to-current converter to a voltage; a first current source; a first semiconductor device connected to the first current source in series; a control voltage generator that generates a voltage according to the threshold voltage of the first semiconductor device, and a second semiconductor device that generates current responsive to the combination of a voltage generated in the control voltage generator and a voltage converted by the first resistance, wherein a current with a characteristic responsive to current flowing into the second semiconductor device is supplied to the semiconductor devices.

2. The high-frequency power amplifier circuit according to claim 1 wherein the control voltage generator has a voltage follower that receives a voltage according to the threshold voltage of the first semiconductor device, and the output terminal of the voltage follower is connected to the first resistance and is arranged to receive current supplied from the voltage-to-current converter via the first resistance.

3. The high-frequency power amplifier circuit according to claim 2, further comprising a second current source that is connected to the control terminal of the second semiconductor device and sinks current supplied from the voltage-to-current converter.

4. The high-frequency power amplifier circuit according to claim 3, wherein the first current source has a differential circuit that receives constant voltage from a constant-voltage circuit as an input and a third semiconductor device that passes a constant current according to the output voltage of the differential circuit.

5. The high-frequency power amplifier circuit according to claim 4, wherein the differential circuit has an output connected to the gate terminal of a fourth semiconductor device arranged so as to form a current mirror circuit with the third semiconductor device, the second resistance is connected to the fourth semiconductor device in series, the differential circuit outputs voltage proportional to the constant voltage when a potential at the point of interconnection of the fourth semiconductor device and the second resistance is fed back to the input terminal of the differential circuit, the third semiconductor device is driven by the voltage output from the differential circuit to carry constant current, and the second resistance is an external device.

6. The high-frequency amplifier circuit according to claim 5, wherein the second current source has a second differential circuit that receives a constant voltage from the constant-voltage circuit as an input and a fifth semiconductor device that supplies constant current according to the output of the second differential circuit.

7. The high-frequency amplifier circuit according to claim 6, wherein the second differential circuit has an output connected to a gate terminal of a sixth semiconductor device that is arranged so as to form a current mirror circuit with the fifth semiconductor device; a third resistance is connected to the sixth semiconductor device in series, the second differential circuit outputs a voltage proportional to the constant voltage when a potential at the point of interconnection of the sixth semiconductor device and the third resistance is fed back to the input terminal of the second differential circuit, the fifth semiconductor device is driven by the voltage output from the second differential circuit to carry constant current, and the third resistance and the first to sixth semiconductor devices are formed on a semiconductor chip.

8. The high-frequency power amplifier circuit according to claim 7, wherein the first resistance, the second semiconductor device, and the second current source are provided corresponding to each of the plurality of the semiconductor power devices, a resistance value of the first resistance provided corresponding to each of the plurality of the semiconductor power devices and a current value of the second current source provided corresponding to each of the plurality of the semiconductor power devices are set to mutually differing values.

9. A high-frequency power amplifier circuit device comprising:
    a first power transistor having an input terminal, a first terminal and a second terminal, and formed on a semiconductor chip;
    a first capacitor which has a first terminal and a second terminal coupled to the input terminal of the first power transistor, and via which a high frequency input signal to be amplified is supplied to the input terminal of the first power transistor;
    a bias circuit including a first transistor which has an input terminal, a first terminal and a second terminal and which is arranged so as to form a current mirror circuit with the first power transistor, and a first circuit receiving a control signal and providing to the first transistor a current signal according to the control signal;
    a second power transistor having an input terminal,
    a first terminal, and a second terminal and
    a second capacitor coupled between the first terminal of the first power transistor and the input terminal of the second power transistor, wherein a signal based on an output signal from the first terminal of the first power transistor is provided to the input terminal of the second power transistor via the second capacitor,
    wherein the bias circuit includes a second transistor which has an input terminal, a first terminal and a second terminal and which is adapted to operate as a diode by coupling the input terminal with the first terminal, and a second circuit receiving the control signal and providing a current signal according to the control signal to the second transistor, wherein the second power transistor is biased by the bias circuit so that a current flowing in the second power transistor is dependent on a current flowing in the second transistor.

10. A high-frequency power amplifier circuit device according to claim 9, wherein each of the first transistor and the second transistor is a field-effect transistor, wherein the current signal of the first circuit is provided to the first terminal of the first transistor and the current signal of the second circuit is provided to the first terminal of the second translator.

11. A high-frequency power amplifier circuit device according to claim 10, wherein the input terminal of the first power transistor is coupled to the input terminal of the first transistor of the bias circuit and the input terminal of the second power transistor is coupled to the input terminal of the second transistor of the bias circuit.

12. A high-frequency power amplifier circuit device according to claim 10, wherein each of the first power transistor end the second power transistor is a field-effect transistor.

13. A high-frequency power amplifier circuit device formed on a single semiconductor chip, comprising:
    a first semiconductor power transistor;
    a first capacitor which is coupled to the first semiconductor power transistor and via which a high frequency signal to be amplified is inputted to the first semiconductor power transistor,
    a first semiconductor transistor that is arranged so as to form a current mirror circuit with the first semiconductor power transistor; and
    a first bias circuit providing a current according to a control voltage to the first semiconductor transistor,
    wherein the first bias circuit includes:
        a first circuit generating a current signal according to the control voltage;
        a first current source;
        a second semiconductor transistor adapted to generate a first voltage according to a threshold voltage of the second semiconductor transistor by connecting the second semiconductor transistor to the first current source in series;
        a voltage follower circuit having an input terminal arranged to receive the first voltage and an output terminal; and
        a second circuit having an input terminal which is coupled to the output terminal of the voltage follower circuit and to which the current signal is supplied from the first circuit, and an output terminal, and generating the current to be provided to the first semiconductor transistor.

14. A high-frequency power amplifier circuit device according to claim 13, further comprising a current-voltage converter circuit coupled between the output of the voltage follower circuit and the input terminal of the second circuit.

15. A high-frequency power amplifier circuit device according to claim 14, wherein the second circuit includes a voltage-current converter which converts a voltage at the input terminal thereof into the current to be provided to the first semiconductor power transistor.

16. A high-frequency power amplifier circuit device according to claim 15, further comprising a second current source coupled to the input terminal of the second circuit.

17. A high-frequency power amplifier circuit device according to claim 16, wherein the first semiconductor power transistor is a field-effect transistor, and each of the first semiconductor transistor and the second semiconductor transistor is field-effect transistor.

18. A high-frequency power amplifier circuit device according to claim 17, wherein the current-voltage converter circuit is a resistance.

19. A high-frequency power amplifier circuit device according to claim 13, further comprising:
    a second semiconductor power transistor;
    a second capacitor which is coupled to the second semiconductor power transistor via which a high frequency signal based on an output signal of the first semiconductor power transistor is inputted to the second semiconductor power transistor;
    a third semiconductor transistor that is arranged so as to form a current mirror circuit with the second semiconductor power transistor; and
    a second bias circuit providing a current to the third semiconductor transistor.

20. A high-frequency power amplifier circuit device according to claim 19, wherein the second bias circuit generates a current according to a voltage at the input terminal of the second circuit as the current to be provided to the third semiconductor transistor.

21. A high-frequency power amplifier circuit device according to claim 20, further comprising a current-voltage converter circuit coupled between the output of the voltage follower circuit and the input terminal of the second circuit.

22. A high-frequency power amplifier circuit device according to claim 21, wherein the current-voltage converter circuit is a resistance.

23. A high-frequency power amplifier circuit device according to claim 19, wherein the second bias circuit includes:
    a third circuit generating a current signal according to the control voltage; and
    a fourth circuit having an input terminal which is coupled to the output terminal of the voltage follower circuit and to which the current signal is supplied from the third circuit, and an output terminal, and generating the current to be provided to the second semiconductor transistor.

24. A high-frequency power amplifier circuit device according to claim 23, further comprising a first current-voltage converter circuit coupled between the output terminal of the voltage follower circuit and the input terminal of the second circuit, and a second current-voltage converter circuit coupled between the output terminal of the voltage follower circuit and the input terminal of the fourth circuit.

25. A high-frequency power amplifier circuit device according to claim 24, further comprising a third current source coupled to the input terminal of the second circuit and a fourth current source coupled to the input terminal of the fourth circuit.

26. A high-frequency power amplifier circuit device according to claim 25, wherein each of the first current-voltage converter circuit and the second current-voltage converter circuit is a resistance.

27. A high-frequency power amplifier circuit device according to claim 19, wherein each of the second semiconductor power transistor and the third semiconductor transistor is a field-effect transistor.

28. A high-frequency power amplifier circuit device according to claim 22, wherein each of the second semiconductor power transistor and the third semiconductor transistor is a field-effect transistor.

29. A high-frequency power amplifier circuit device according to claim 26, wherein each of the second semiconductor power transistor and the third semiconductor transistor is a field-effect transistor.

* * * * *